(12) United States Patent
Gilton et al.

(10) Patent No.: US 6,751,114 B2
(45) Date of Patent: Jun. 15, 2004

(54) METHOD FOR PROGRAMMING A MEMORY CELL

(75) Inventors: Terry L. Gilton, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/109,088

(22) Filed: Mar. 28, 2002

(65) Prior Publication Data

US 2003/0185036 A1 Oct. 2, 2003

(51) Int. Cl.$^7$ ................................................ G11C 17/00
(52) U.S. Cl. ................................... 365/100; 365/185.24
(58) Field of Search .............................. 365/100, 185.24

(56) References Cited

U.S. PATENT DOCUMENTS

| | | | |
|---|---|---|---|
| 3,622,319 A | 11/1971 | Sharp | 430/396 |
| 3,743,847 A | 7/1973 | Boland | 250/505.1 |
| 4,269,935 A | 5/1981 | Masters et al. | 430/323 |
| 4,312,938 A | 1/1982 | Drexler et al. | 430/496 |
| 4,316,946 A | 2/1982 | Masters et al. | 430/9 |
| 4,320,191 A | 3/1982 | Yoshikawa et al. | 430/296 |
| 4,405,710 A | 9/1983 | Balasubramanyam et al. | 430/311 |
| 4,419,421 A | 12/1983 | Wichelhaus et al. | 429/323 |
| 4,499,557 A | 2/1985 | Holmberg et al. | 257/767 |
| 4,671,618 A | 6/1987 | Wu et al. | 349/92 |
| 4,795,657 A | 1/1989 | Formigoni et al. | 365/163 |
| 4,800,526 A | 1/1989 | Lewis | 365/118 |
| 4,847,674 A | 7/1989 | Sliwa et al. | 427/96 |
| 5,177,567 A | 1/1993 | Klersy et al. | 257/4 |
| 5,219,788 A | 6/1993 | Abernathey et al. | 438/636 |
| 5,238,862 A | 8/1993 | Blalock et al. | 438/398 |
| 5,272,359 A | 12/1993 | Nagasubramanian et al. | 257/40 |
| 5,314,772 A | 5/1994 | Kozicki | 430/14 |
| 5,315,131 A | 5/1994 | Kishimoto et al. | 257/57 |
| 5,350,484 A | 9/1994 | Gardner et al. | 438/669 |
| 5,360,981 A | 11/1994 | Owen et al. | 257/4 |
| 5,483,494 A * | 1/1996 | Taura | 365/185.21 |
| 5,500,532 A | 3/1996 | Kozicki et al. | 250/372 |
| 5,512,328 A | 4/1996 | Yoshimura et al. | 427/498 |
| 5,512,773 A | 4/1996 | Wolf et al. | 257/471 |
| 5,726,083 A | 3/1998 | Takaishi | 438/210 |
| 5,751,012 A | 5/1998 | Wolstenholme et al. | 257/5 |
| 5,761,115 A | 6/1998 | Kozicki et al. | 365/182 |
| 5,789,277 A | 8/1998 | Zahorik et al. | 438/95 |
| 5,841,150 A | 11/1998 | Gonzalez et al. | 257/3 |
| 5,846,889 A | 12/1998 | Harbison et al. | 501/40 |

(List continued on next page.)

FOREIGN PATENT DOCUMENTS

| | | |
|---|---|---|
| JP | 56126915 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

(List continued on next page.)

*Primary Examiner*—Michael Tran
(74) *Attorney, Agent, or Firm*—Dickstein Shapiro Morin & Oshinsky LLP

(57) ABSTRACT

A method for reading and verifying the state of a memory cell during a write operation before writing allows a decision to be made whether to write to the cell or not based on the current state of the cell.

25 Claims, 5 Drawing Sheets

U.S. PATENT DOCUMENTS

| | | | |
|---|---|---|---|
| 5,896,312 A | 4/1999 | Kozicki et al. | 365/153 |
| 5,914,893 A | 6/1999 | Kozicki et al. | 365/107 |
| 5,920,788 A | 7/1999 | Reinberg | 438/466 |
| 5,998,066 A | 12/1999 | Block et al. | 430/5 |
| 6,072,716 A | 6/2000 | Jacobson et al. | 365/163 |
| 6,077,729 A | 6/2000 | Harshfield | 438/128 |
| 6,084,796 A | 7/2000 | Kozicki et al. | 365/153 |
| 6,117,720 A | 9/2000 | Harshfield | 438/238 |
| 6,143,604 A | 11/2000 | Chiang et al. | 438/253 |
| 6,177,338 B1 | 1/2001 | Liaw et al. | 438/629 |
| 6,236,059 B1 | 5/2001 | Wolstenholme et al. | 257/3 |
| 6,297,170 B1 | 10/2001 | Gabriel et al. | 438/738 |
| 6,300,684 B1 | 10/2001 | Gonzalez et al. | 257/774 |
| 6,316,784 B1 | 11/2001 | Zahorik et al. | 257/3 |
| 6,329,606 B1 | 12/2001 | Freyman et al. | 174/260 |
| 6,348,365 B1 | 2/2002 | Moore et al. | 438/130 |
| 6,350,679 B1 | 2/2002 | McDaniel et al. | 438/634 |
| 6,376,284 B1 | 4/2002 | Gonzalez et al. | 438/129 |
| 6,388,324 B2 | 5/2002 | Kozicki et al. | 257/750 |
| 6,391,688 B1 | 5/2002 | Gonzalez et al. | 438/128 |
| 6,414,376 B1 | 7/2002 | Thakur et al. | 257/640 |
| 6,418,049 B1 * | 7/2002 | Kozicki et al. | 365/174 |
| 6,423,628 B1 | 7/2002 | Li et al. | 438/622 |
| 6,469,364 B1 | 10/2002 | Kozicki | 257/529 |
| 6,473,332 B1 | 10/2002 | Ignatiev et al. | 365/148 |
| 6,487,106 B1 | 11/2002 | Kozicki | 365/153 |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0163828 A1 | 11/2002 | Krieger et al. | |
| 2002/0168820 A1 | 11/2002 | Kozicki et al. | |
| 2002/0190350 A1 | 12/2002 | Kozicki | |
| 2003/0001229 A1 | 1/2003 | Moore et al. | |
| 2003/0027416 A1 | 2/2003 | Moore | |
| 2003/0035314 A1 | 2/2003 | Kozicki | |
| 2003/0035315 A1 | 2/2003 | Kozicki | |

OTHER PUBLICATIONS

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17th (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992) 259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a-Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imal, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.K.H.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi, W.K.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number <m>, in network glasses: evidence of a threshold behavior in the slope |dTg/d<m>| at the rigidity percolation threshold (<m>=2.4), J. Non–Cryst. Solids 151 (1992) 149–154.

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hill, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous As$_2$S$_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive* sputter etching in SF$_6$, 42 Appl. Phys. Lett., No. 7, pp. 592–594 (Apr. 1983).

Kawaguchi et al. *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40. No 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineering, vol. 63/1–3,155–159 (2002).

M.N. Kozicki and M. Mitkova, *Silver Incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987)/.

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3365 (1973).

* cited by examiner

METHOD FOR PROGRAMMING A MEMORY CELL

The present invention relates generally to memory cells, and more specifically to glass electrolyte memory cells.

BACKGROUND

A well known semiconductor component is semiconductor memory, such as a random access memory (RAM). RAM permits repeated read and write operations on memory cells. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMs and SDRAMs also typically store data in capacitors which require periodic refreshing to maintain the stored data.

In recent years, the number and density of memory cells in memory devices has been increasing. Accordingly, the size of each cell has been shrinking, which in the case of DRAMs also shortens the cells' data holding time. Typically, a DRAM memory device relies on cell capacity for data storage and receives a refresh command in a conventional standardized cycle, about once every 100 milliseconds. However, with increasing cell number and density, it is becoming more and more difficult to refresh all memory cells at least once within a refresh period. In addition, refresh operations consume power.

Recently, programmable conductor memory elements have been investigated for suitability as semi-volatile and non-volatile random access memory cells. Kozicki et al. in U.S. Pat. Nos. 5,761,115; 5,896,312; 5,914,893; and 6,084,796, disclose a programmable conductor memory element including an insulating dielectric material formed of a chalcogenide glass disposed between two electrodes. A conductive material, such as silver, is incorporated into the dielectric material. The resistance of such material can be changed between high resistance and low resistance states. The programmable conductor memory is normally in a high resistance state when at rest. A write operation to a low resistance state is performed by applying a voltage potential across the two electrodes. The electrode having the more positive voltage applied thereto functions as an anode, while the electrode held at a lower potential functions as a cathode. The mechanism by which the resistance of the cell is changed is not fully understood. In one theory suggested by Kozicki et al., the conductivity-doped dielectric material undergoes a structural change at a certain applied voltage with the growth of a conductive dendrite or filament between the electrodes, effectively interconnecting the two electrodes and setting the memory element in a low resistance state. The dendrite is thought to grow through the resistance variable material in a path of least resistance.

No matter what the theory, the low resistance state will remain intact for days or weeks after the voltage potentials are removed. Such material can be returned to its high resistance state by applying a reverse voltage potential between the electrodes of at least the same magnitude as used to write the cell to the low resistance state. Again, the highly resistive state is maintained once the voltage potential is removed. This way, such a device can function, for example, as a resistance variable memory element having two resistance states, which can define two logic states.

The dendrite will continue to grow after it shorts the electrodes, provided a potential is applied or reapplied. The dendrite's growth rate before it shorts the electrodes is at a rate much faster than after it shorts, but growth does continue. A problem with certain apparatuses that are capable of using the programmable cell is that if too great a potential is applied, or if the potential is applied for too long a time period, the dendrite becomes sufficiently large and strong that it is not broken by simply reversing the potential. Once this happens, the cell is essentially static, that is, it cannot be reprogrammed with any degree of precision.

There is therefore a need in the art for a way to avoid programming an already programmed programmable cell of the type described.

SUMMARY OF THE INVENTION

In one embodiment, a method of programming a glass electrolyte memory cell includes determining a desired value of the memory cell, reading a currently programmed cell value from the cell, and writing the desired value to the cell only if the currently programmed value is outside a predetermined range.

In another embodiment, a method of programming a glass electrolyte memory cell includes determining a desired value of the cell, and reading an actual value of the cell. The desired value and the actual value are compared, and the desired value is written to the cell only if the desired value and the actual value differ.

In yet another embodiment, a method of writing to a glass electrolyte memory cell includes initiating a write operation with a desired write value to the cell, decoding a cell address to be written, reading an actual value of the cell at the decoded address, and comparing the actual value of the cell with the desired value. The desired value is written to the cell if the actual value is outside a predetermined range, and the write operation is terminated without writing to the cell if the actual value is within the predetermined range.

In still another embodiment, a method of operating a glass electrolyte memory cell includes initiating a write operation with a desired cell state, determining, before writing, whether a current state of the cell is the same as the desired state, and determining whether to write the desired cell state to the cell depending upon the current state of the cell.

In still yet another embodiment, a circuit includes a cell reader to read a current state from a glass electrolyte memory cell and a comparator to compare the current state to a desired state of the memory cell.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figure 1:
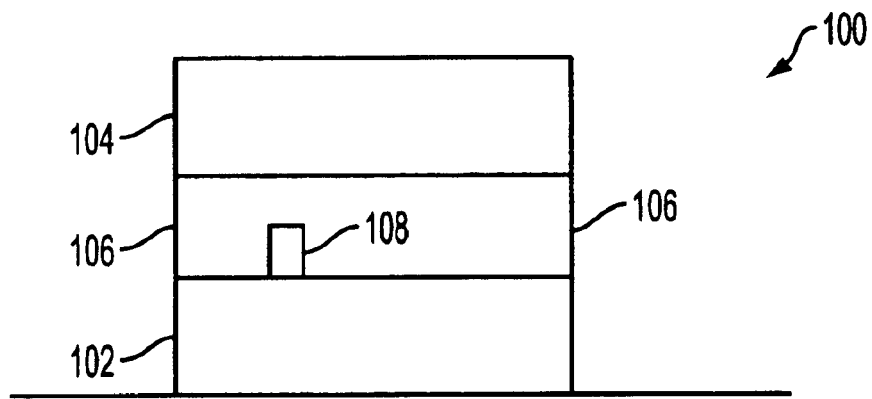
FIG. 1 is a simplified cross-section of a programmable cell upon which embodiments of the present invention may be practiced.
Figure 2:
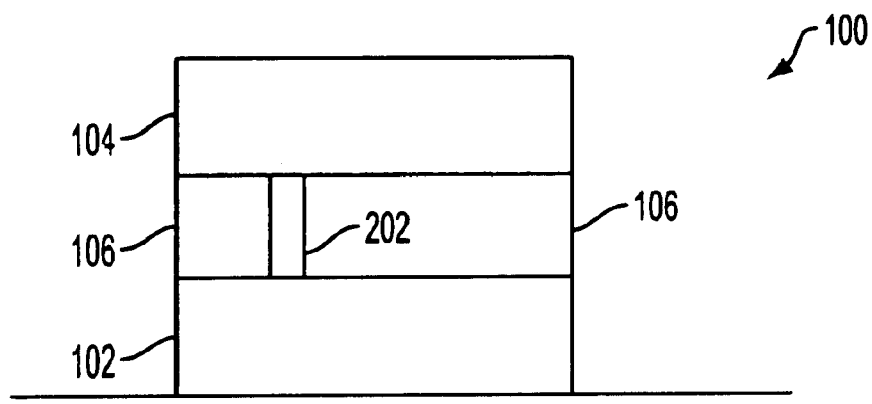
FIG. 2 is a flow chart diagram of a method according to one embodiment of the present invention.

Referring to FIG. 1, a simplified cross-section of a typical programmable cell 100 such as a glass electrolyte cell on which embodiments of the present invention can be practiced is shown. Cell 100 comprises an anode 102 and a cathode 104. Between the anode 102 and the cathode 104 is a body 106 comprised of a glass electrolyte such as a chalcogenide glass with conductive ions dissolved therein. The cell 100 operates as follows. When a potential is applied to the anode 102, the current flow in the electrolyte causes dissolved ions from the electrolyte to begin plating on the cathode 104. The resulting structure 108 is a resistance variable material which begins to extend from the cathode toward the anode, eventually reaching the cathode if sufficient potential is applied for sufficient time. FIG. 2 shows a resistance variable material 202 fully bridging a gap between anode 102 and cathode 104. While a vertical cell is shown in FIGS. 1 and 2, lateral cells are also within the scope of the present invention.

In a memory cell using the programmable cell 100, a 1 value for the cell is provided when a potential has been applied at a sufficient level and for a sufficient time to result in a resistance variable material shorting the two electrodes. It is desirable, as mentioned above, to avoid further application of potential so as to avoid permanent resistance variable materials.

When reading a cell such as the glass electrolyte type of cell described above, it is important not to read at a potential that will cause further programming of the cell that might affect permanence of the cell structure. For example, if a cell is read at too high a level, further growth of an already grown resistance variable material could be effected which would cause the resistance variable material to reach or even exceed its threshold of potential for creating a permanent resistance variable material. For these reasons, typical read potentials are significantly lower than programming potentials. In one method, a cell value is read at a predetermined cell read potential. The cell read potential in one embodiment is less that a threshold potential for the cell itself. In one embodiment of a glass electrolyte cell, the threshold potential is approximately 250 millivolts, and the cell read potential is approximately 100 millivolts, although this voltage is higher in other embodiments, depending upon pulse time. Various read methods are employable with a cell such as a glass electrolyte cell as described above. By way of example only and not by way of limitation, such methods include reading the resistance of the cell at a cross point, or using a DRAM style read method using a sense amplifier and treating the cell like a DRAM cell.

Figure 3:
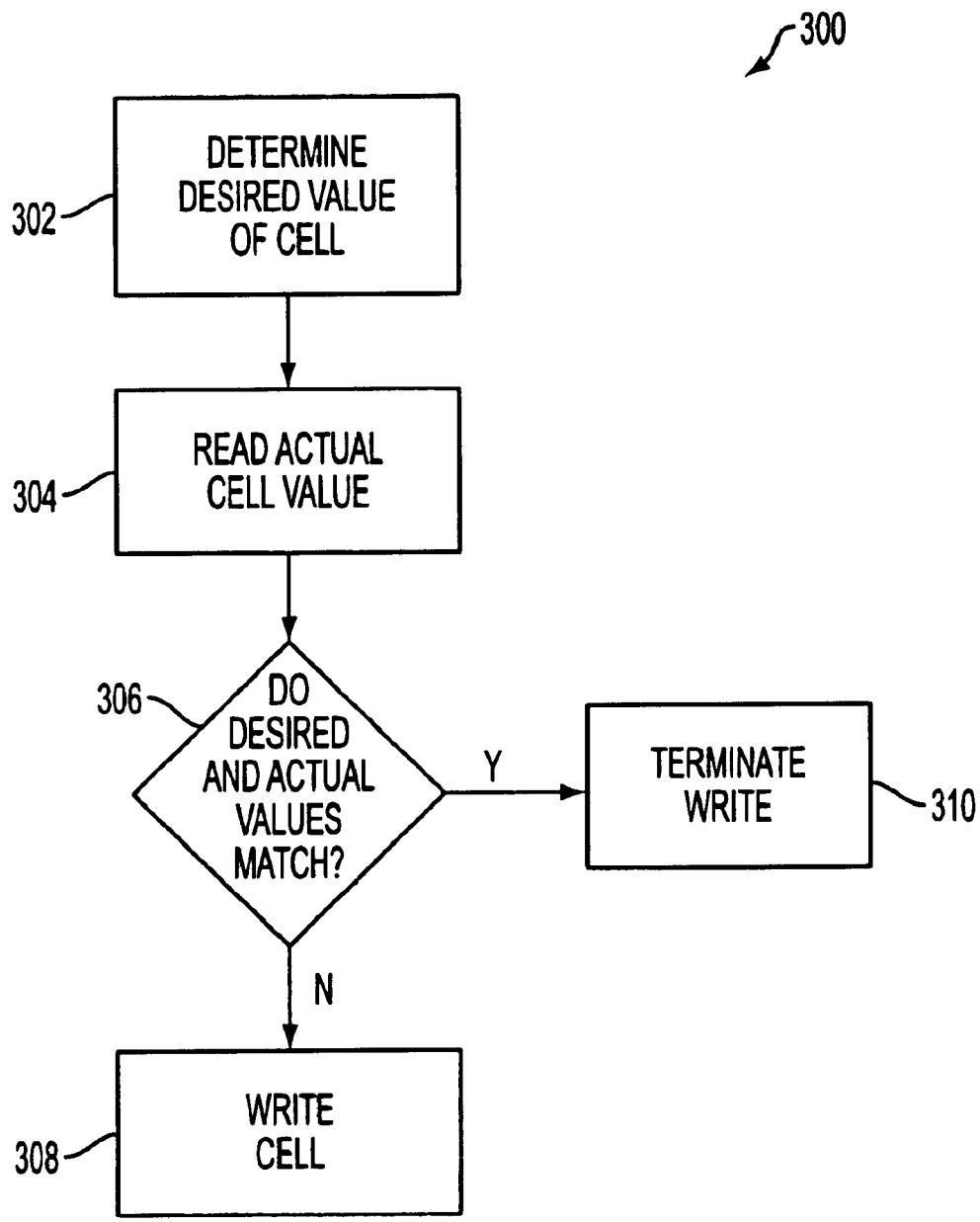
FIG. 3 is a flow chart diagram of a method according to another embodiment of the present invention.
Figure 4:
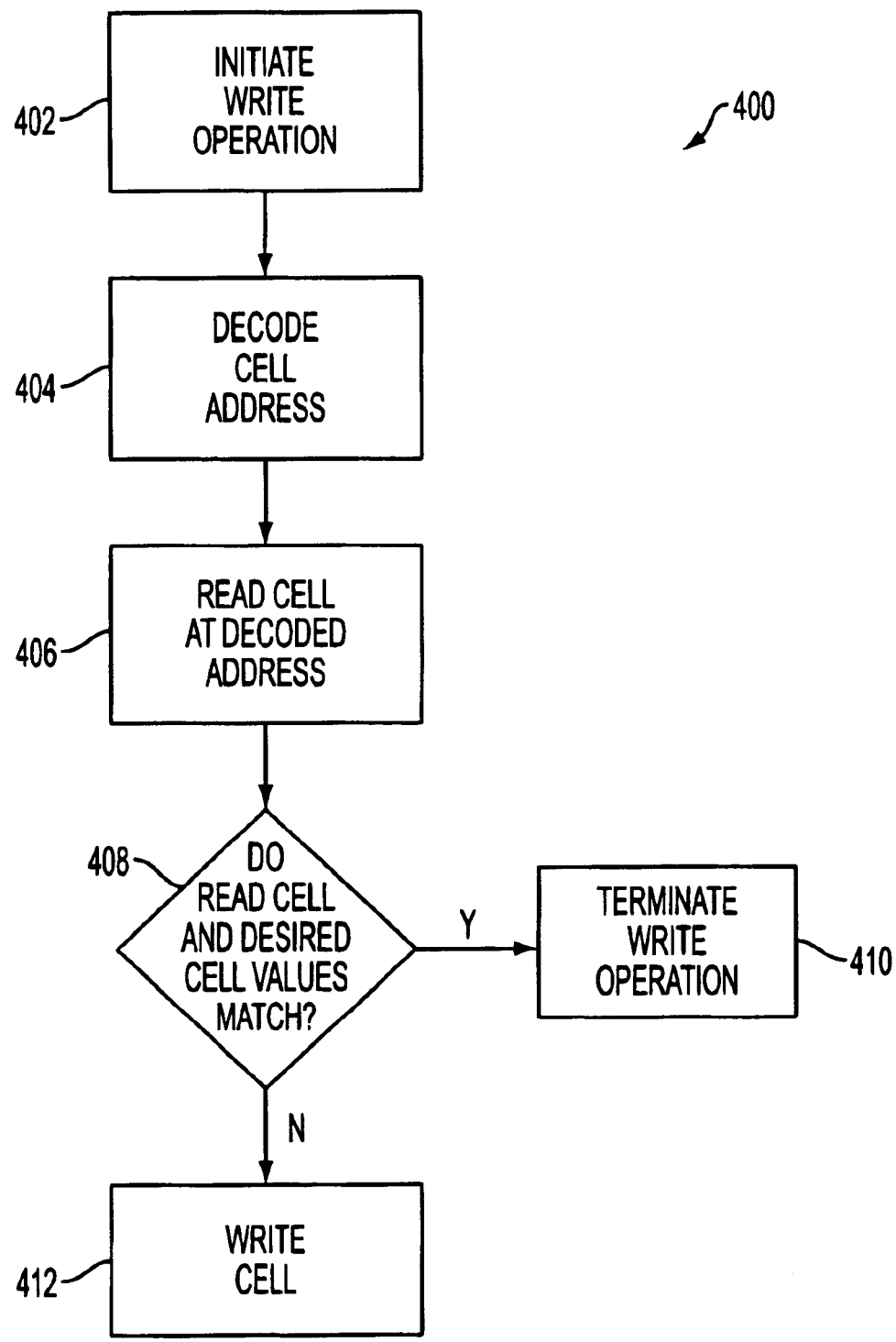
FIG. 4 is a flow chart diagram of a method according to yet another embodiment of the present invention.
Figure 5:
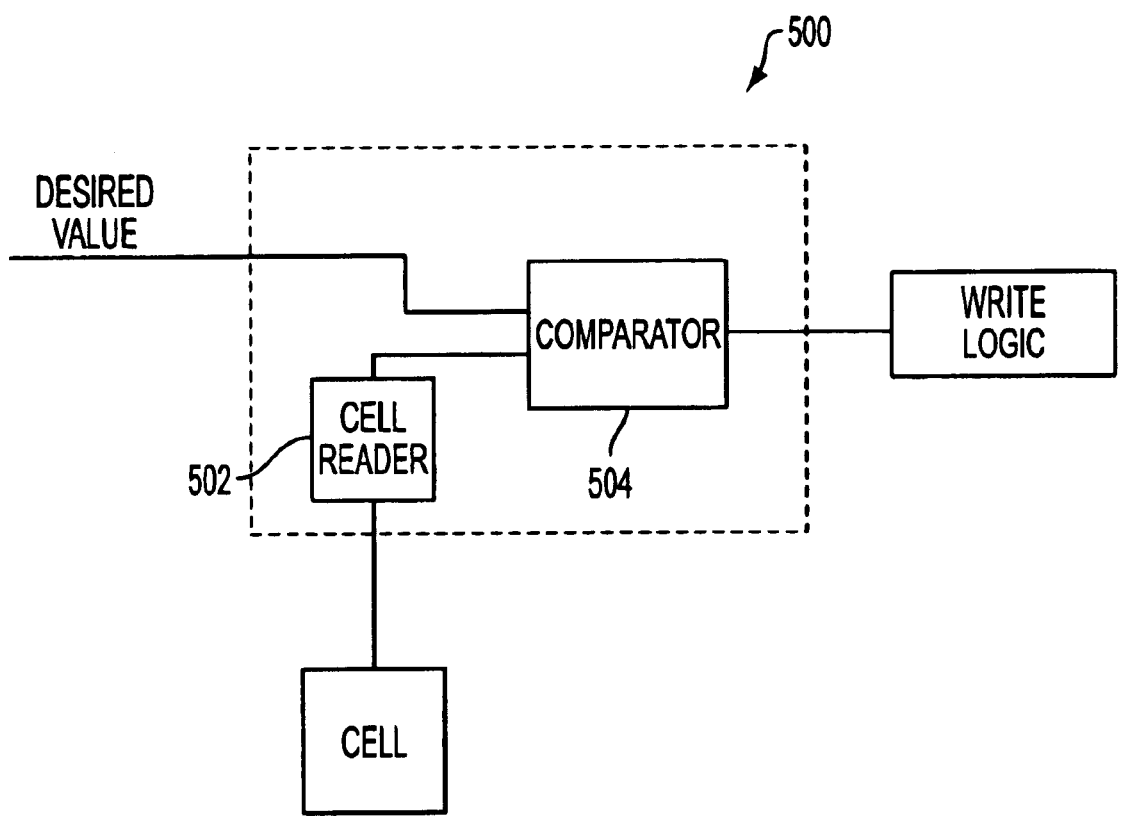
FIG. 5 is a block diagram of a circuit according to another embodiment of the present invention.

A method for programming a glass electrolyte cell 300 according to an embodiment of the invention is shown in FIG. 3. Method 300 comprises determining what the value of a particular cell is supposed to be in block 302, reading the cell in block 304, comparing the value read from the cell to the value the cell is supposed to have in block 306, and writing the cell only if the comparison is negative in block 308. If the comparison is positive, the write operation is terminated in block 310. In one embodiment, the comparison is made between the read cell value and a predetermined range of values. If the read value falls within the predetermined range of values, the cell is not written. If the read value is outside the predetermined range of values, the cell is written.

In one embodiment, a resistance value above a certain threshold is evaluated as a zero (0) and a resistance value below a certain threshold is evaluated as a one (1). The threshold values need not be the same. In one embodiment, a resistance value over a threshold of approximately one million (1,000,000) Ohms is evaluated as a zero, while a resistance value below a threshold of approximately one hundred thousand (100,000) Ohms is evaluated as a one. The desired value of any particular cell is stored in various embodiments in a lookup table or other similar storage. Reading of the cell is accomplished in any number of ways, including conventional sensing using a sense amp circuit as is used in DRAM memories, or other methods. Examples of other methods include by way of example only and not by way of limitation, measuring resistance of the cell at a cross point, treating the cell like a cell and access device of a DRAM, and the like. The comparison of the value read from the cell and the desired value is also straightforward, and in one embodiment is accomplished using a comparator that will output a first binary value when the values match and a second binary value when the cells do not match. In one embodiment, a match is determined versus a predetermined range of acceptable cell values as described above.

If after reading the value of the cell and the desired value of the cell, and after comparing the two values to see if they match, writing of the cell is effected only if the desired value and the actual cell value do not match. If the values do match, the cell is already programmed to its desired state, and no writing is undertaken. Because no writing is undertaken, no possibility of permanently programming the cell exists for this write operation.

For example, the value of a cell is read. The read value is compared to a predetermined range of acceptable cell values. If the read cell value is within the range, the cell is not written. If the read cell value is outside the range, the cell is written.

In another embodiment 400, the state of a cell is verified during a write operation, and a decision is made as to whether the cell is actually written or not based upon the state of the cell. A write operation is initiated in block 402. As the write operation commences, the address of the particular cell that is to be written is decoded in standard fashion in block 404. Once the address is decoded, the cell at the address is read in block 406. The value read from the cell is compared with the value desired to be written to the cell in comparison block 408. If the values match, the write operation is terminated in block 410. If the values do not match, then the write operation is completed in block 412. The tradeoff in requiring a check of the state of the cell is more than made up for by the much slower refresh rates required for operation of the memory cell based on the programmable cell technology. This method avoids the inadvertent programming of a cell such that the programming become permanent.

In another embodiment, a circuit 500 for effecting a write operation on a cell is shown. Circuit 500 comprises cell reader 502 connectable to a cell such as cell 100 to read the value of the cell, a comparator 504 to receive the value read from the cell by the cell reader 502 and an external, desired value of the cell and to out put a signal indicative of whether the values match. The signal is presented to a write block, which effects a write if the signal indicates write, and which terminates if the desired and actual cell values match. The cell reader in one embodiment comprises a comparator which reads the line value.

Figure 6:
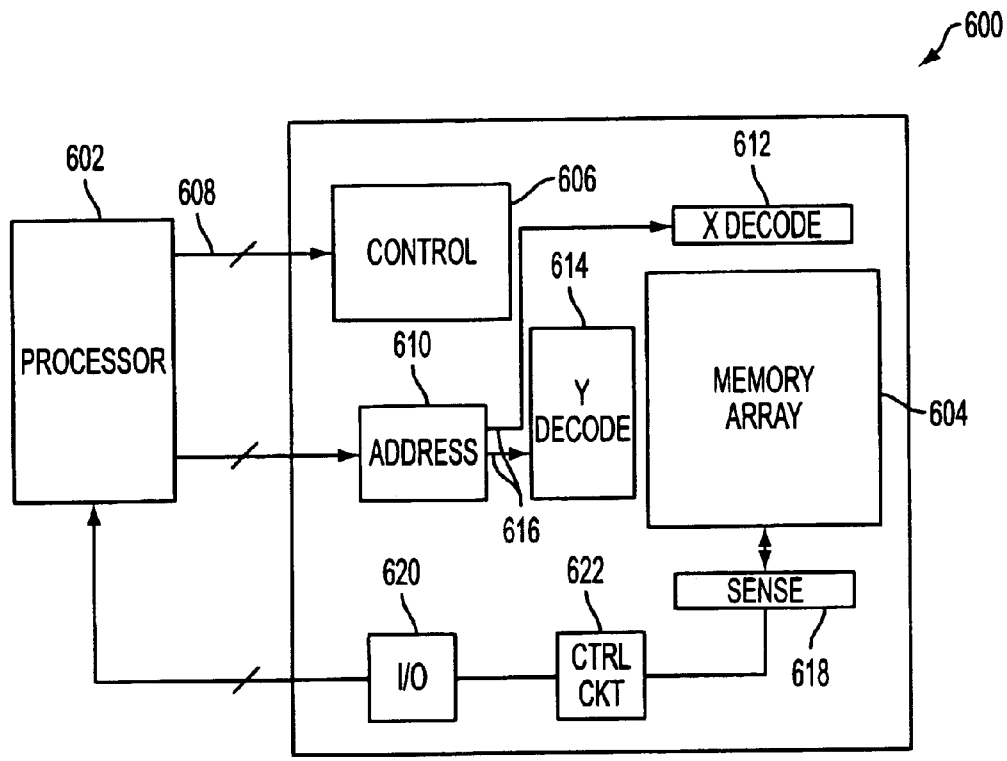
FIG. 6 is a block diagram of a memory device according to another embodiment of the present invention.

Referring to FIG. 6, a simplified block diagram of a memory device 600 of the present invention is described.

The memory device can be coupled to a processor 602 for bi-directional data communication. The memory includes an array of memory cells 604. Control circuitry 606 is provided to manage data storage and retrieval from the array in response to control signals 608 from the processor. Address circuitry 610, X-decoder 612 and Y-decoder 614 analyze address signals 616 and storage access locations of the array. Sense circuitry 618 is used to read data from the array and couple output data to I/O circuitry 620. The I/O circuitry operates in a bi-directional manner to receive data from processor 602 and pass this data to array 604. A second control circuit 622 such as circuit 500 is interposed between the sense circuitry 618 and the input/output circuitry 620. The second control circuit 622 compares the actual current state of the ROM bit to be written and the desired state to be written to the ROM bit as described above.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of programming a glass electrolyte memory cell, comprising:
   determining a desired value of the memory cell;
   reading a currently programmed cell value; and
   writing the desired value only if the currently programmed value is outside a predetermined range.

2. The method of claim 1, wherein reading a currently programmed cell value comprises:
   determining a threshold read potential; and
   reading a value from the cell at the read potential.

3. The method of claim 2, wherein reading the value comprises:
   sensing the resistance of the cell; and
   comparing the sensed resistance to a known resistance curve to determine the value.

4. A method of programming a glass electrolyte memory cell, comprising:
   determining a desired value of the cell;
   reading an actual value of the cell;
   comparing the desired value and the actual value; and
   writing the desired value to the cell only if the actual value is outside a predetermined range.

5. The method of claim 4, and further comprising:
   terminating the write operation without writing if the actual value is within the predetermined range.

6. The method of claim 4, wherein reading an actual value of the cell comprises: reading a value from the cell at a predetermined read potential.

7. The method of claim 6, wherein the predetermined read potential is approximately 100 millivolts.

8. The method of claim 6, wherein reading the value comprises:
   measuring the resistance of the cell; and
   comparing the measured resistance to a known resistance curve to determine the value.

9. A method of writing to a glass electrolyte memory cell, comprising:
   initiating a write operation with a desired write value to the cell;
   decoding a cell address to be written;
   reading an actual value of the cell at the decoded address;
   comparing the actual value of the cell with the desired value;
   writing the desired value to the cell if the actual value is outside a predetermined range; and
   terminating the write operation if the actual value is within the predetermined range.

10. The method of claim 9, wherein reading an actual value of the cell comprises:
    determining a threshold read potential; and
    reading a value from the cell at the read potential.

11. The method of claim 10, wherein reading the value comprises:
    sensing the resistance of the cell; and
    comparing the sensed resistance to a known resistance curve to determine the value.

12. A method of reading a glass electrolyte memory cell, comprising:
    selecting a read potential that is less than a threshold programming potential for said memory cell; and
    reading a value from the cell at the read potential, wherein reading a value comprises:
    sensing the resistance of the cell; and
    comparing the sensed resistance to a known resistance curve to determine the value.

13. The method of claim 12, wherein the read potential is approximately 100 millivolts.

14. A method of operating a glass electrolyte memory cell, comprising:
    initiating a write operation with a desired cell state;
    determining, before writing, whether a current state of the cell is the same as the desired state; and
    determining whether to write the desired cell state to the cell depending upon the current state of the cell.

15. The method of claim 14, wherein determining whether a current state of the cell is the same as the desired state comprises:
    reading the current state of the cell; and
    comparing the current state of the cell and the desired state of the cell.

16. The method of claim 15, wherein comparing is accomplished with a comparator.

17. The method of claim 14, and further comprising:
    writing the desired value to the cell only if the current state is outside a predetermined range.

18. In a glass electrolyte memory cell, a method of operating the cell, comprising:
    determining the value to which the cell is desired to be programmed;
    reading the value in the cell;
    comparing the desired value with the read value; and
    writing the desired value if the read value is outside a predetermined range.

19. A circuit, comprising:
    a cell reader to read a current state from a glass electrolyte memory cell; and
    a comparator to compare the current state to a desired state of the memory cell; and
    a second comparator to compare the current state of the cell with a known cell state curve stored in a lookup table.

20. A memory device comprising:

an array of glass electrolyte memory cells;

row and column address circuitry to decode received row and column addresses;

input/output circuitry to receive external data and to pass the data to the array; and a circuit to compare a bit to be written to a cell in the array to a current state of the cell.

21. The memory device of claim 20, wherein the circuit comprises:

a cell reader to read a current state from one of the cells; and a comparator to compare the current state to a desired state of the memory cell.

22. A processing system, comprising:

a memory controller; and a read only memory embedded dynamic random access memory device coupled to the memory controller and comprising:

a random access memory having a first portion programmable as a read only memory and a second portion programmable as a random access memory; and a circuit to compare a bit to be written to a cell in the array to a current state of the cell.

23. The processing system of claim 22, wherein the circuit comprises:

a cell reader to read a current state from one of the cells; and a comparator to compare the current state to a desired state of the memory cell.

24. A method of programming a glass electrolyte memory cell, comprising:

determining a desired value of the cell;

reading an actual value of the cell;

writing the desired value to the cell only if the actual value of the cell is outside a predetermined write range for the cell.

25. The method of claim 24, wherein the predetermined write range comprises a set of values comparing the desired value and the actual value; and writing the desired value to the cell only if the desired value and the actual value differ by a predetermined amount.

* * * * *